United States Patent [19]

Brower

[11] Patent Number: 4,676,738
[45] Date of Patent: Jun. 30, 1987

[54] MINIATURIZED PHOTOFLASH ARRAY FABRICATION PROCESS

[75] Inventor: Boyd G. Brower, Williamsport, Pa.

[73] Assignee: GTE Products Corporation, Danvers, Mass.

[21] Appl. No.: 325,068

[22] Filed: Nov. 25, 1981

[51] Int. Cl.$^4$ .............................................. F21K 5/02
[52] U.S. Cl. ...................................... 431/359; 362/13
[58] Field of Search .................... 431/359, 357, 365; 29/847, 623, 622; 362/13, 14, 15; 361/402, 404, 409; 337/297; 315/200 A, 323

[56] References Cited

U.S. PATENT DOCUMENTS

| | | | |
|---|---|---|---|
| 3,548,494 | 12/1970 | Haring | 29/847 |
| 4,017,728 | 4/1977 | Audesse et al. | 431/359 X |
| 4,170,034 | 10/1979 | Brower | 431/359 X |
| 4,234,304 | 11/1980 | Heytmeijer | 431/359 |
| 4,330,821 | 5/1982 | Brower et al. | 431/359 X |

OTHER PUBLICATIONS

Mac D., W., *Stamped Wiring*, Jun. 1947.

Primary Examiner—Samuel Scott
Assistant Examiner—Noah Kamen
Attorney, Agent, or Firm—Thomas H. Buffton

[57] ABSTRACT

A process for manufacturing a miniaturized multilamp photoflash array includes a switch fabricating process wherein a strip of N/C switching material is fabricated, affixed to a circuit board and that portion of the switching material not required for a switch removed.

15 Claims, 3 Drawing Figures

MINIATURIZED PHOTOFLASH ARRAY FABRICATION PROCESS

TECHNICAL FIELD

This invention relates to the fabrication of miniaturized photoflash arrays and more particularly to the manufacture of normally-closed switches utilized in miniaturized multilamp photoflash arrays.

BACKGROUND ART

Generally, there are numerous multilamp photoflash arrays wherein series and parallel-connected lamps are sequentially fired. Such arrays frequently involve heat sensitive switching devices which react to a proximate radiant energy output and respond by melting, fusing or reacting chemically to alter an electrical circuit path from a normally conductive to a normally non-conductive state.

Examples of the above-described arrays are presented in numerous U.S. patents, and a particular example is U.S. Pat. No. 3,532,931 of Cote et al wherein current-sensitive switches are in series connection with individual flashlamps. Another example is found in U.S. Pat. No. 3,692,995 of Wagner wherein fuses are connected in series with each lamp and upon ignition of a selected lamp develop sufficient heat to melt the fuse and remove a short circuit across the next lamp in sequence.

A further example of radiant energy responsive switches which fuse, melt or react chemically to provide a non-conductive electrical path is set forth in U.S. Pat. No. 4,017,728 of Audesse et al. Therein, a plurality of normally conductive switches are fabricated from a heat shrinkable polymeric material and positioned in operative relationship to a flashlamp or radiant energy source. Upon activation of the radiant energy source, the mid-portion of the normally conductive switch, which bridges an aperture rapidly shrinks and separates. Thus, an electrically conductive path is rendered electrically non-conductive and provides an open circuit to applied voltages.

Normally, the above-described switches are fabricated and affixed to a printed circuit board as individual switches with the switch material cut to size and affixed at opposite ends to a pair of switch contacts. However, it has been found that such techniques for fabricating arrays become extremely difficult, if not impossible, when a miniaturized array is under consideration. More specifically, miniaturized arrays have a relatively narrow space between switches as well as a relatively small space between the switch contacts. Thus, it becomes most difficult to handle and position a relatively small piece of switch material on a miniaturized multilamp photoflash array.

OBJECTS AND SUMMARY OF THE INVENTION

An object of the present invention is to provide an improved miniaturized photoflash array. Another object of the invention is to enhance the switching capabilities of a miniaturized photoflash array. Still another object of the invention is to provide an improved process for manufacturing a switch for a miniature photoflash array. A further object of the invention is to provide an improved normally-closed (N/C) switching capability in a miniaturized multilamp photoflash array.

These and other objects, advantages and capabilities are achieved in one aspect of the invention by a miniaturized multilamp photoflash array manufacturing process wherein a printed circuit board is formed, a strip of normally-closed switching material is fabricated, the strip of switching material is affixed to switch contacts aligned and spaced on the printed circuit board, the switch material is removed intermediate the switch contacts other than certain ones forming a switch and a plurality of flashlamps are affixed to the circuit board.

In another aspect of the invention, a normally-closed switch is formed by a process wherein a plurality of aligned and spaced switch contacts are formed on a printed circuit board, a strip of normally-closed switching material is fabricated, the strip of normally-closed switching material is deposited onto the printed circuit board and the normally-closed switching material is removed intermediate certain ones of the switch contacts on the circuit board whereby a plurality of spaced and aligned normally-closed switches are provided.

BEST MODE FOR CARRYING OUT THE INVENTION

For a better understanding of the present invention, together with other and further objects, advantages and capabilities thereof, reference is made to the following disclosure and appended claims in conjunction with the accompanying drawings.

Figure 1:
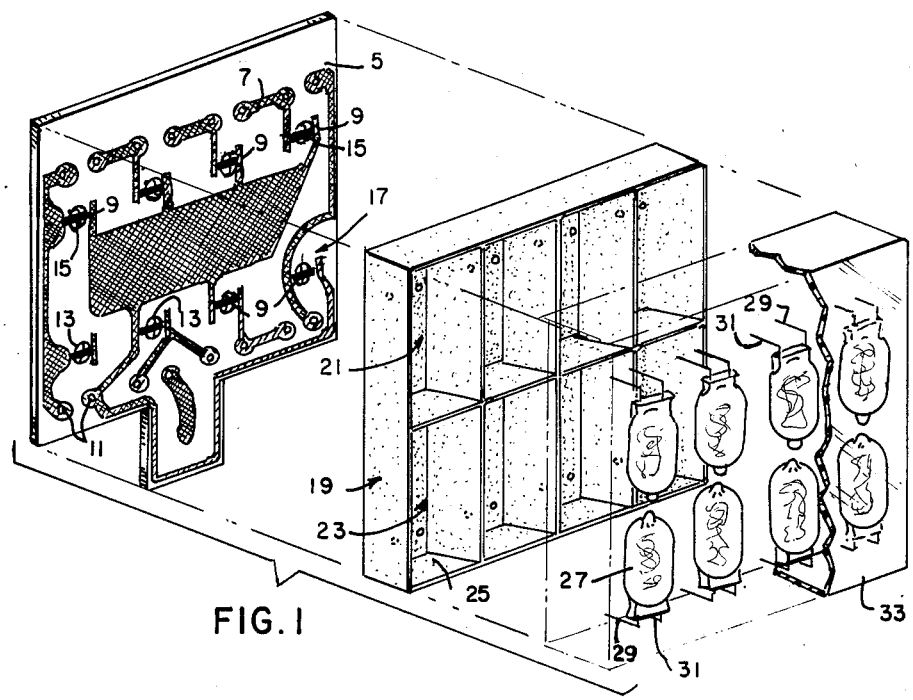
FIG. 1 is an exploded view of a preferred form of miniaturized photoflash array of the invention.

Referring to the drawings, FIG. 1 illustrates an exploded view of a preferred form of miniaturized multilamp photoflash array. Herein, a circuit board 5 includes a multiplicity of conductors 7 thereon providing electrically conductive paths. A plurality of switch contacts 9 are connected to the conductors 7 as are a plurality of lamp-receiving contacts 11. These conductors 7 extending from the switch contacts 9 and from the lamp-receiving contacts 11 are located and positioned such that they are spaced from and aligned with one another. Also, an aperture 13 in the circuit board 5 is provided intermediate each pair of the above-mentioned spaced conductors 7 extending from the switch contacts 9 and lamp-receiving contacts 11. Moreover, a normally-closed (N/C) switching material portion 15 bridges each of the apertures 13 and is affixed at opposite ends to the spaced conductors 7 extending from the switch contacts 9 and the lamp-receiving contacts 11. Thus, a plurality of aligned and spaced N/C switches 17 are positioned on the circuit board 5.

Adjacent the circuit board 5 is a reflector unit 19 having upper and lower sectors 21 and 23 with a plurality of spaced lamp receiving cavities 25 therein. This reflector unit 19 is preferably of a relatively inexpensive plastic material, either white or having a reflective surface theron, and formed by any one of a number of well known techniques, such as thermoforming or injection-molding.

Disposed within each one of the lamp-receiving cavities 25 is a flashlamp 27. Each flashlamp 27 includes a pair of electrically conductive leads 29 and 31 extending outwardly therefrom and formed for passage through the reflector unit 19 and attachment to the lamp-receiving contacts 11 of the circuit board 5. Moreover, a light transparent plastic cover 33 encloses the flashlamps 27 and reflector unit 19 and is affixed to the circuit board 5.

Referring back to miniaturized multilamp photoflash arrays and the previously-mentioned problems associated with the fabrication of individual switches for such arrays, it has been found that switch fabrication for miniature arrays is feasible without the undesired inconvenience of attempting to handle very small pieces of N/C switching material. In the process, a printed circuit board is formed having a plurality of spaced conductors 7 and a plurality of spaced and aligned switch contacts 9. Also, a plurality of apertures 13 are located in the circuit board 5 intermediate each pair of switch contacts 9.

A strip of normally-closed (N/C) switching material is fabricated in a manner set forth in the previously-mentioned U.S. Pat. No. 4,017,728 of Audesse et al which is incorporated herein by reference. Therein, a normally-closed switching material of heat shrinkable polymeric material, such as a thin strip of polyethylene, polypropylene or polystyrene, is rendered electrically conductive by depositing a layer of electrically conductive material thereon. Also, a layer of adhesive is preferably affixed to the strip of switching material to provide for attachment thereof to a surface.

Figure 2:
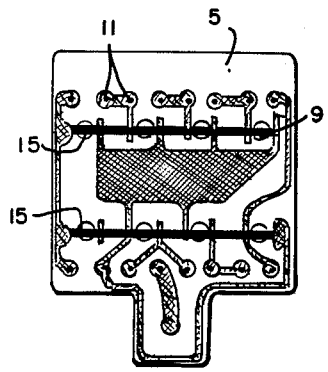
FIG. 2 is a diagrammatic illustration of an affixed strip of switching material prior to the provision of a plurality of normally-closed (N/C) switching.
Figure 3:
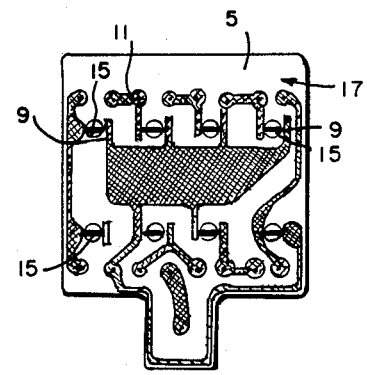
FIG. 3 illustrates a circuit board having the aligned and spaced N/C switches thereon.

Thereafter, the strip of N/C switching material, as illustrated in FIG. 2, is deposited onto the printed circuit board 5 and in contact with and affixed to the switch contacts 9. Also, the strip of N/C switching material bridges the apertures 13 disposed intermediate certain ones of the switch contacts 9. Then, the strip of N/C switching material disposed intermediate switch contacts 9 wherein an aperture 13 is not present is removed, as by heat from spaced prongs for example, to leave a plurality of spaced and aligned switches 17 as illustrated in FIG. 3.

Following, a plurality of flashlamps 27 is attached to the lamp receiving contacts 11 of the conductors 7 on the circuit board 5. Each of these flashlamps is positioned immediately adjacent one of the spaced and aligned switches 17 and each switch 17 is responsive to radiation from a flashlamp 27 to cause the switch 17 to become electrically non-conductive. In other words, radiant energy from an adjacent flashlamp 27 provides heat in an amount sufficient to shrink or otherwise disconnect the normally-closed (N/C) switching material and interrupt current flow intermediate the switch contacts 9 of an adjacent switch 17.

More specifically, one particular embodiment of the above-described miniaturized multilamp photoflash array included a plurality of spaced and aligned switches fabricated by the enumerated manufacturing process. Therein, each of the switches 17 was of a length, A of FIG. 1, of about 0.190 inches which required a length of switching material of about 0.190 inches. Also, the switches 17 were spaced, B of FIG. 1, by a distance in the range of about 0.060 to 0.090 inches. Thus, the reduced cost and complexity of handling a strip of switching material, as compared with the cost and complexity of handling such relatively short lengths of switching material, more than compensates for the cost of removing and loss of the length of switching material intermediate the switches 17. In other words, the ease of attaching a strip of switching material more than compensates for the 0.060 to 0.090 inches of switching material removed from between the spaced and aligned switches 17.

Thus, it can be seen that the above-described process wherein a plurality of spaced and aligned switches 17 for a miniaturized photoflash array are fabricated from a strip of N/C switching material has numerous advantages over prior known individual switch fabrication techniques. Since the array is miniaturized, a minimum of switch material waste is present intermediate the aligned and spaced switches. Moreover, material handling efficiency is greatly enhanced and fabrication time reduced.

While there have been shown and described what is at present considered the preferred embodiments of the invention, it will be obvious to those skilled in the art that various changes and modifications may be made therein without departing from the invention as defined by the appended claims.

INDUSTRIAL APPLICABILITY

An enhanced normally-closed (N/C) switch fabrication process for a miniaturized multilamp photoflash array has been provided. Moreover, an improved process for fabricating miniaturized multilamp photoflash arrays has been provided. Not only does the process greatly reduce the cost and time required to handle very small portions of switch material but also improves the reliability and consistency of the resultant structure.

I claim:

1. A normally-closed switch manufacturing process suitable for a miniaturized photoflash array comprising the steps of:
    forming a plurality of aligned and spaced switch contacts on a printed circuit board with apertures intermediate certain ones of said switch contacts;
    fabricating a strip of normally-closed (N/C) switching material;
    depositing said strip of N/C switching material onto said printed circuit board to electrically connect said aligned and spaced switch contacts; and
    removing said N/C switching material intermediate switch contacts other than said certain ones of said aligned and spaced contacts having said apertures therebetween to provide a plurality of aligned and spaced N/C switches.

2. The N/C switch manufacturing process of claim 1 wherein said removing of said N/C switching material intermediate switch contacts other than said certain ones of said aligned and spaced switch contacts is effected by melting said switching material intermediate switch contacts other than said certain ones to provide aligned and spaced N/C switches.

3. The N/C switch manufacturing process of claim 1 wherein said N/C switching material intermediate other than said certain ones of said aligned and spaced switch contacts having said apertures therebetween is of a length in the range of about 0.060 to 0.090 inches.

4. The N/C switch manufacturing process of claim 1 wherein said switching material intermediate said certain ones of said aligned and spaced switch contacts having said apertures therebetween is of a length of about 0.190 inches.

5. The N/C switch manufacturing process of claim 1 wherein aligned and spaced switch contacts on said printed circuit board have a minimum spacing in the range of about 0.060 to 0.090 inches and a maximum spacing of about 0.190 inches.

6. In a miniature photoflash array having a printed circuit board with a plurality of affixed circuit conductors, a plurality of spaced and aligned switch contacts and an aperture intermediate certain ones of said switch contacts, a normally-closed switch manufacturing process comprising the steps of fabricating a continuous strip of normally-closed (N/C) switching material, affixing said switching material to said spaced and aligned switch contacts, and removing said N/C switching material intermediate said switch contacts other than those certain ones having said apertures therebetween whereby said switching material affixed to said switch contacts having said apertures therebetween remains to provide said normally-closed switches.

7. The N/C switch manufacturing process of claim 6 wherein said removal of N/C switching material intermediate said switch contacts other than those certain ones having said apertures therebetween is effected by melting said switching material intermediate said switch contacts other than those certain ones having said apertures therebetween.

8. The N/C switch manufacturing process of claim 6 wherein said removed switching material intermediate other than said certain ones of said switch contacts having said apertures therebetween is of a length in the range of about 0.060 to 0.090 inches.

9. The N/C switch manufacturing process of claim 6 wherein said switching material intermediate said certain ones of said switch contacts having said apertures therebetween is of a length of about 0.190 inch.

10. The N/C switch manufacturing process of claim 6 wherein said switch contacts having said apertures therebetween include said switching material affixed to said contacts and bridging said apertures to form a N/C switch of heat shrinkable material.

11. A process for manufacturing a miniaturized multilamp photoflash array comprising the steps of:

forming a printed circuit board having spaced conductive runs and a plurality of aligned and spaced switch contacts with apertures intermediate certain ones of said switch contacts;

fabricating a strip of normally-closed (N/C) switching material; affixing said strip of N/C switching material to said aligned and spaced switch contacts;

removing said N/C switching material intermediate said aligned and spaced switch contacts other than said certain ones having said apertures therebetween to provide a plurality of strips of switching material bridging said apertures; and attaching a plurality of flashlamps to said printed circuit board in a location to provide a radiation responsive operational relationship with said switching material bridging said apertures.

12. The process for manufacturing the miniaturized multilamp photoflash array of claim 11 wherein said N/C switching material intermediate said aligned and spaced switch contacts other than said certain ones having said apertures therebetween is removed by melting.

13. The process for manufacturing the miniaturized multilamp photoflash array of claim 11 wherein said N/C switching material intermediate said aligned and spaced switch contacts other than said certain ones having said apertures therebetween is of a length in the range of about 0.060 to 0.090 inches.

14. The process of manufacturing the miniaturized multilamp photoflash array of claim 15 wherein said switching material intermediate said certain ones of said switch contacts having said apertures therebetween is of a length of about 0.190 inches.

15. The process for manufacturing the miniaturized multilamp photoflash array of claim 11 wherein said N/C switching material is in the form of a heat shrinkable polymeric material.

* * * * *